United States Patent
Rahimo et al.

(10) Patent No.: US 12,034,363 B2
(45) Date of Patent: Jul. 9, 2024

(54) ADJUSTABLE HYBRID SWITCH FOR POWER CONVERTERS AND METHODS OF OPERATING THE SAME

(71) Applicant: MTAL GMBH, Gänsbrunn (CH)

(72) Inventors: Munaf Rahimo, Solothurn (CH); Renato Minamisawa, Windisch Aargau (CH); Silvia Mastellone, Nussbaumen Aargau (CH)

(73) Assignee: MTAL GMBH, Gansbrunnen So (CH)

( * ) Notice: Subject to any disclaimer, the term of this patent is extended or adjusted under 35 U.S.C. 154(b) by 3 days.

(21) Appl. No.: 17/769,978

(22) PCT Filed: Oct. 16, 2020

(86) PCT No.: PCT/EP2020/079224
§ 371 (c)(1),
(2) Date: Apr. 18, 2022

(87) PCT Pub. No.: WO2021/074387
PCT Pub. Date: Apr. 22, 2021

(65) Prior Publication Data
US 2022/0376605 A1    Nov. 24, 2022

(30) Foreign Application Priority Data
Oct. 17, 2019    (GB) .................................. 1915004

(51) Int. Cl.
*H02M 1/088*    (2006.01)
*H03K 17/567*    (2006.01)

(52) U.S. Cl.
CPC .......... *H02M 1/088* (2013.01); *H03K 17/567* (2013.01)

(58) Field of Classification Search
CPC ............................ H02M 1/088; H03K 17/567
See application file for complete search history.

(56) References Cited

U.S. PATENT DOCUMENTS 10,381,949 B2    8/2019  Hamerski et al.
2014/0185346 A1  7/2014  Liu
(Continued)

FOREIGN PATENT DOCUMENTS

CN    105958804 B  *  8/2018

OTHER PUBLICATIONS

International Search Report dated Jan. 21, 2021 for corresponding International Application No. PCT/EP2020/079224.
(Continued)

*Primary Examiner* — Metasebia T Retebo
(74) *Attorney, Agent, or Firm* — TAROLLI, SUNDHEIM, COVELL & TUMMINO L.L.P.

(57) ABSTRACT

A hybrid switch for a power converter and a method of operating said hybrid switch, the hybrid switch comprising: at a minimum a first and a second element comprising one or more switching devices of a first semiconductor type, and at a minimum a third element comprising one or more switching devices of a second semiconductor type, wherein the second semiconductor type is different from the first semiconductor type, and wherein each element is independently configurable and connected to a separate respective control terminal; and, a controller connected to the control terminals, wherein the controller is configured to control each element independently through each respective control terminal, and wherein the controller is further configured to activate elements based on a measured or estimated current and/or power as required by an operating condition of the converter.

9 Claims, 6 Drawing Sheets

(56) References Cited

U.S. PATENT DOCUMENTS

2016/0191021 A1* 6/2016 Zhao .................... H03K 17/567
  327/109
2018/0097390 A1 4/2018 Kube

OTHER PUBLICATIONS

Rahimo, et al. (2015). "Characterization of a Silicon IGBT and Silicon Carbide MOSFET Cross-Switch Hybrid", IEEE Transactions on Power Electronics, 30(9), pp. 4638-4642. doi:10.1109/tpel.2015.2402595.

* cited by examiner

ADJUSTABLE HYBRID SWITCH FOR POWER CONVERTERS AND METHODS OF OPERATING THE SAME

RELATED APPLICATIONS

This application claims the benefit of PCT Application Serial No. PCT/EP2020/079224, filed Oct. 16, 2020, entitled "ADJUSTABLE HYBRID SWITCH FOR POWER CONVERTERS AND METHODS OF OPERATING THE SAME", which claims the benefit of G.B. Application Serial No. 1915004.4, filed Oct. 17, 2019, entitled "ADJUSTABLE HYBRID SWITCH FOR POWER CONVERTERS AND METHODS OF OPERATING THE SAME". The entirety of these applications is hereby incorporated by reference for all purposes.

FIELD OF THE INVENTION

The subject matter disclosed herein relates to the field of converter circuits and, more specifically, to a hybrid switch configuration for converter circuits.

BACKGROUND

In most power electronics converters, the operational conditions are very dependent on the application and can vary widely with respect to the level of electrical loading. For example, many applications run, for the majority of time, at full load conditions with bursts of over-load transients (up to 200% of nominal current), while many other applications contain large periods where the converter is either running at sub-load conditions or is in idle mode (below 10% of nominal current). Nevertheless, the losses under such conditions could represent a large element of the overall losses of that particular application.

Traditionally, almost all applications utilise a set of devices which are operating with the same area and characteristics over the full range of operational conditions. Hence, they do suffer from non-optimum behaviour from the losses and controllability point of views under certain conditions during operation. For example, Silicon based power devices can provide reasonable converter efficiencies during nominal operating conditions. Due to the lower semiconductor device cost, it is relatively straightforward to address the over-load conditions, by simply adding more devices in parallel, which also increases the size of the system. However, under such design conditions, the operation mode in sub-load conditions will be negatively impacted. Silicon Carbide (SiC) and other wide bandgap power devices can provide increased power converter efficiency and power density because they can be operated at higher switching frequencies and temperatures. However, power converters built exclusively with SiC power devices will significantly increase the semiconductor device cost, especially if the power converters need to meet any overload requirements and the semiconductor devices are sized according to overload requirements.

Figure 1:
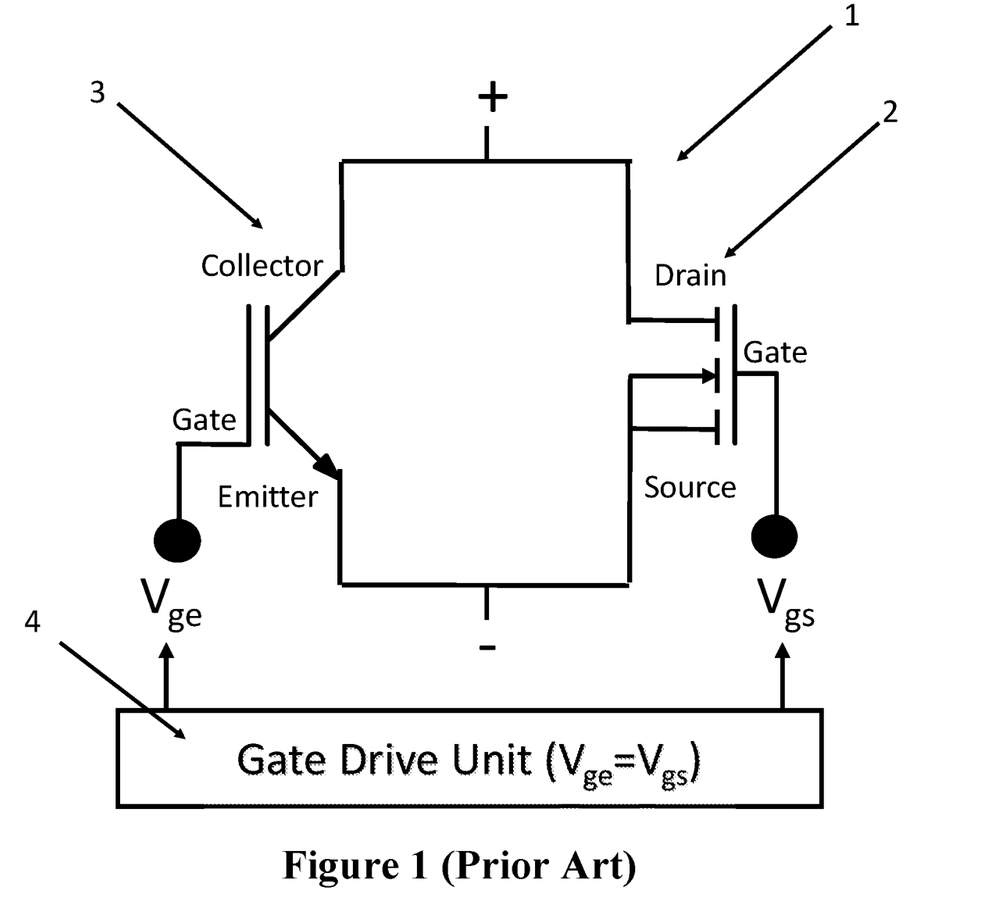
FIG. 1: Cross Switch XS Hybrid with two separate elements (Si IGBT and SiC MOSFET) without diode (prior art).
Figure 2:
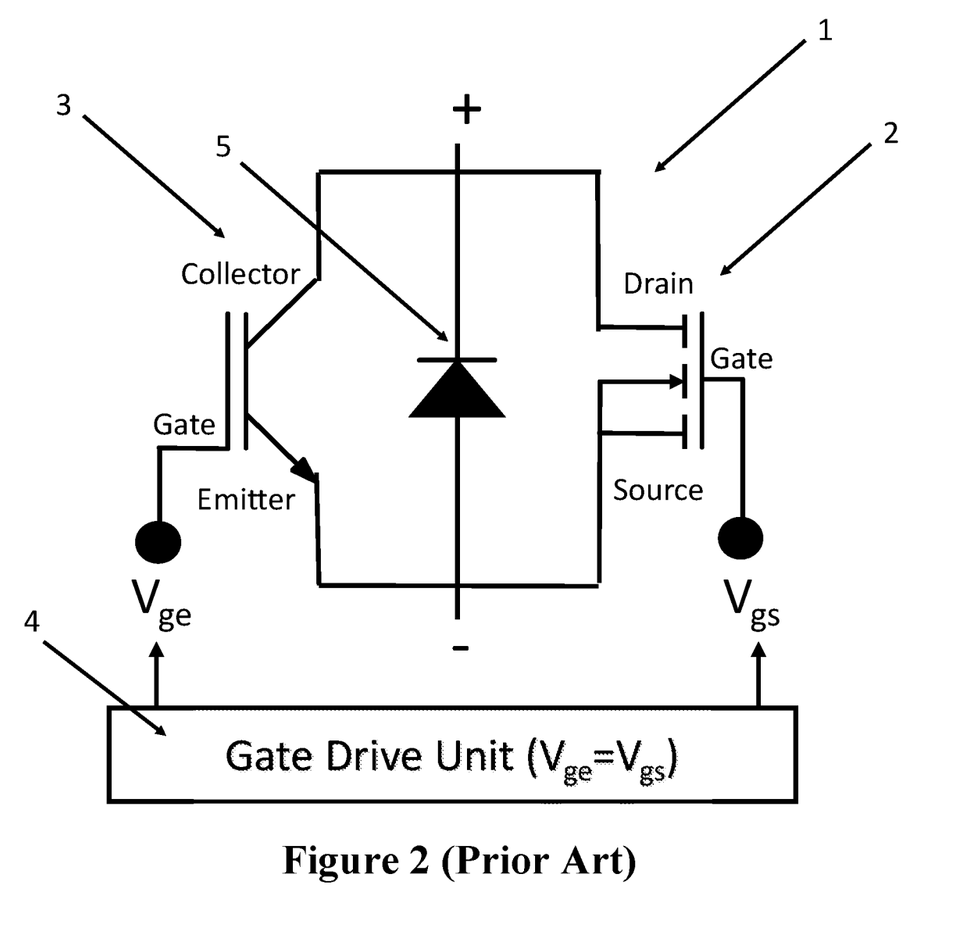
FIG. 2: Cross Switch XS Hybrid with two separate elements (Si IGBT and SiC MOSFET) with diode (prior art).

Hybrid switch (1) type of solutions have been previously proposed so that the power converters can optimize the cost of semiconductor devices with the optimal performance in a range of different operational conditions. These hybrid switch solutions combine different types of power semiconductor devices, usually arranged in a parallel configuration as shown in FIG. 1 and FIG. 2 for the Cross Switch XS Hybrid solution described in the article entitled "Characterization of a Silicon IGBT and Silicon Carbide MOSFET Cross Switch Hybrid", IEEE Transaction on Power Electronics Letters, Vol. 30, No. 9, September 2015. In this prior art, a Si IGBT (3) device is paralleled with a SiC MOSFET (2) device, with and without using an additional separate diode (5). The two devices can be driven with separate or the same gate drive unit (4). Nevertheless, such hybrid switch solutions maintain a given or constant area ratio between the different devices. It has been shown that the device performance varies widely depending on the chosen area ratio and hence non-optimum performance under certain conditions will still be present for such concepts.

Figure 3:
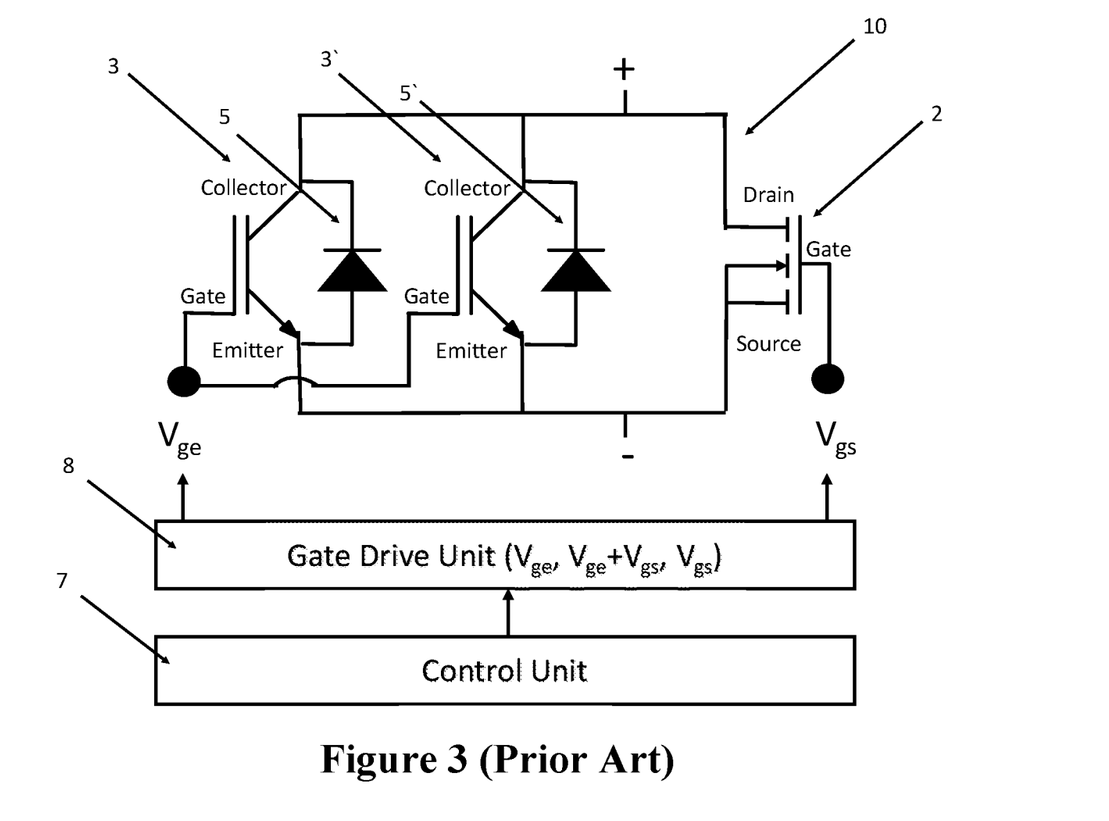
FIG. 3: Hybrid switch with two separate elements (Si IGBTs and SiC MOSFET), and three operating modes: SiC MOSFET only, Hybrid, Si IGBT only (prior art).

Other prior art solutions, as shown in FIG. 3 and disclosed in U.S. Pat. No. 9,397,657 or in U.S. application Ser. No. 15/359,850, filed Nov. 23, 2016, provide the option to include two elements in the hybrid switch configuration (10): a SiC MOSFET element (2), Si IGBT elements (3) and (3'), a first gate associated within the SiC MOSFET element (2), and a second gate associated with the IGBT elements (3) and (3'). The SiC MOSFET element (2) and the IGBT elements (3) and (3'), of the hybrid switch (10) are configured to be independently controlled via the control unit (7) and the gate drive unit (8) consisting of a first Si IGBT gate and the second SiC MOSFET gate. The operating mechanism switches between using exclusively one type of element to another, or both types of elements (e.g., SiC MOSFET element alone, both types of elements (SiC MOSFET/Si IGBT), and Si IGBT elements alone). Similar to other prior art, one major limitation of this approach is that the semiconductor area ratio of SiC MOSFET to Si IGBT is defined at the design stage by the number of respective device chips being used in the hybrid switch, and cannot be further modified or adjusted during the subsequent operation of the converters using such hybrid switches.

Figure 4:
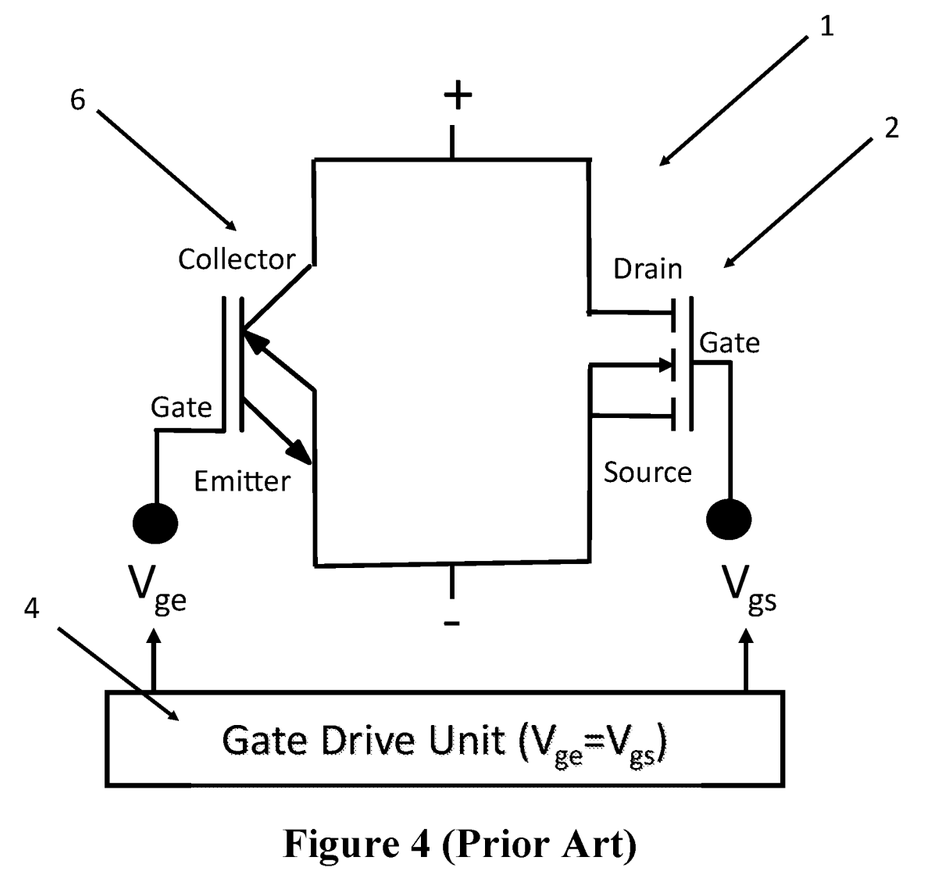
FIG. 4: Bimode Cross Switch BXS Hybrid integrated diode (prior art).

Furthermore, most hybrid switch solutions do not address the issue of the performance of the diode, because standard diodes cannot be controlled via a gate voltage. And hence, applying such hybrid switch concepts must take into account the diode behaviour and not only the performance of the gate-controllable power devices. A previous solution to this problem is to ensure that both power devices used in a hybrid switch configuration are of reverse conducting type, meaning a diode functionality is integrated in the same device, with said diode having a strong performance dependency on the gate voltage bias. This was disclosed for example in the article entitled "The Cross Switch "XS" Silicon and Silicon Carbide Hybrid Concept" PCIM Conference Proceedings, NURNBERG, GERMANY, May 2015. The solution proposed there also combines two elements, a SiC MOSFET element and a Silicon Reverse Conducting RC-IGBT (6) element as shown in FIG. 4. By designing the RC-IGBT with strong MOS dependency, the on-state voltage of the diode at a positive gate voltage bias can be strongly affected to ensure the needed current sharing with the channel MOSFET conduction.

Nonetheless, there continues to be a need for more efficient methods of configuring and operating hybrid switches that take into account also the performance of freewheeling diodes, and that can benefit from the contribution of different types of power semiconductors, to achieve higher efficiency, increased operating lifetime, and lower overall costs.

SUMMARY

It may be an object of the present invention to provide a hybrid switch with at least three elements, where first and second elements comprise power semiconductor devices based on a first semiconducting material, and at least a third element comprises power semiconductor devices based on a second semiconducting material. Examples of suitable semiconducting materials include silicon (Si), silicon carbide (SiC), diamond, gallium oxide (Ga$_2$O$_3$), gallium nitride (GaN) and zinc oxide (ZnO). It may also be an object of the present invention to provide methods of operating a hybrid switch configuration.

A hybrid switch configuration according to some embodiments of the invention includes a plurality of elements (which can be switching devices and diodes), with separate control terminals for each element. At a minimum, a first, second and third elements of different semiconductor material type are used therein. These first, second and third elements are electrically coupled together to support parallel currents therein in response to respective control signals received at respective first, second, and third control terminals (e.g., gate terminals) of the first, second and third elements respectively. In the meaning of this invention disclosure, an element of the hybrid switch can be a single chip of a semiconductor material type, or multiple semiconductor chips which are interconnected to the same control terminal (and not to independent control terminals). In some embodiments of the invention, the first, second and third elements may include wide bandgap semiconductor switching devices in combination with silicon switching devices, with at least one switching device having different characteristics compared to the other two switching devices. Typical wide bandgap semiconductor switching devices include SiC MOSFETs and JFETs and typical silicon switching devices include Si-RC-IGBTs, however, other combinations of switching devices are also possible.

These embodiments of the invention may also include a control circuit, or controller, which is configured to independently drive the plurality of control terminals with respective periodic control signals when a plurality of elements is disposed to collectively support a forward current. In addition, the control circuit is further configured to drive only some of the hybrid switch elements corresponding to the value of the current (e.g., forward current) and/or power, for example when the forward current has a lower value only few of the elements are active (e.g., in conduction mode), while for a larger forward current, a larger percentage of the elements are active. In a further example, when the current has a low value fewer of the elements are active than when the current has a medium value, and when the current has a medium value fewer of the elements are active than when the current has a high value.

An example of a high current may be in the range of 300 A to 600 A. An example of a medium current may be in the range of 100 A to 300 A. An example of a low current may be below 100 A. However, it will be appreciated that other ranges for high, medium and low currents are possible. As an example, a typical power rating for a converter application is rated about 150 kW to 200 kW.

According to further embodiments of the invention, the control circuit (or controller) may generate the periodic control signals so that only a subset of the hybrid switch elements is in conduction mode at any given time based on the value of the forward current. The control signal may be controlled to activate each additional element from the plurality of non-conducting elements in the hybrid switch configuration as a function of the forward current. The control circuit, or controller, may be configured to activate elements based on an operating condition of the converter. For example, an operating condition may be characterized by the value of the current. An operating condition may be characterized by a value of the power. The operating condition may be measured by separate sensors, or estimated by the controller.

In an embodiment, the present invention may enable real-time adjustments to semiconductor area ratios of the first semiconductor type to the second semiconductor type. For example, the ratios may be adjusted based on a measured or estimated current and/or power.

According to additional embodiments of the invention, the first and second elements are made of one or more reverse conducting insulated-gate bipolar transistors (e.g., Si RC-IGBT) and the third element is made of one or more switching devices, in the form of three or more terminal devices selected from a group consisting of junction field effect transistors (JFETs), metal oxide semiconductor field effect transistors (MOSFETs), integrated gate-commutated thyristors (IGCT) and high electron mobility transistors (HEMTs). Moreover, the third element may be formed of a wide bandgap semiconductor material selected from a group consisting of silicon carbide (SiC), gallium nitride (GaN) and diamond, for example. According to further additional embodiments of the invention, the first, second, third elements of the hybrid switch are Si RC-IGBTs, and the fourth and fifth elements are three or more terminal switching devices selected from a group consisting of junction field effect transistors (JFETs), metal oxide semiconductor field effect transistors (MOSFETs), and high electron mobility transistors (HEMTs).

According to still further embodiments of the invention, the control circuit (or controller) operates these different elements in the specific manner that the control signal is always applied to some of the elements configured with silicon-based switching devices and some or all of the elements configured with wide bandgap-based switching devices independent of the operating conditions (e.g., forward currents). In the observations of the inventors, there is no clear advantage in applying control signals to only one type of element, e.g., using the conduction through silicon-based elements only or through wide bandgap-based elements only.

Thus, according to some embodiments of the invention, based on the above-described control circuit (or controller) operations, a hybrid switching device containing a plurality of Si RC-IGBTs and a plurality of SiC MOSFET/JFETs may be switched through a monotonically increasing load current using the following configurations, in sequence: (a) at low forward currents, the control signal is applied to the SiC MOSFETs elements and some of the Si RC-IGBTs elements; it is not needed to apply the control signal only to SiC MOSFETs because the Si RC-IGBTs will only start conducting current if the potential across their terminals is above the bipolar threshold value of 0.7 Volts; (b) with increasing forward currents, additional SiC MOSFETs elements and Si RC-IGBT elements are activated one by one based on the targeted performance criteria; in this manner, the ratio of silicon to silicon carbide devices is not fixed anymore and can be adjusted; (c) in over-load conditions, all Si RC-IGBTs elements can be activated; it is not needed to stop applying the control signal to SiC MOSFETs elements, because no current will flow through the SiC MOSFETs due to their high on-state resistance compared to the Si-IGBTs; and (d) since the control signal is applied also to SiC MOSFETs to provide current conduction support, it becomes straightforward to implement a Si RC-IGBT last turn-off procedure, to minimize the switching losses in the semiconductors.

According to some embodiments of the invention, the control circuit (or controller) can be used in freewheeling mode to control the diode semiconductor areas in Si RC-IGBTs elements, by adjusting the applied control signals in a similar way to controlling the current sharing between parallel Si RC-IGBT elements in conduction mode.

Still further embodiments of the invention include a hybrid switch configuration, a power converter, and a system microcontroller (MCU) which processes multiple inputs from monitoring devices, torque and speed of the electrical motor (in case the converter is used to drive a motor for example in electrical cars), current sensing or voltage and frequency of the power grid (in case the converter is used as interface between a renewable energy source system and the electrical network) to enable the controller to assess the operating conditions as close as possible to the reality. In particular, the controller may be configured to activate a finite number of configurations of the elements in the hybrid switch (called also "electrical gears" or "electronic gears") that are automatically set based on the measured or estimated operating conditions of the power converter. Specific optimization criteria can be used (for example minimizing conduction losses, minimising switching losses or increasing the lifetime of the power converter). The configurations of active elements may be estimated by a processor in real time, or can be stored in a look-up table within the processor.

The new hybrid switch configuration offers a wide range of advantages compared to prior art. One of the most significant benefits is that the hybrid switch contains at least three elements, each element having an independent control terminal, allowing each element to be independently controlled. Each element of the hybrid switch can be configured of a single or multiple switching devices controlled by the same control terminal, but at least one of the minimum three elements must be of a different semiconductor type that the other two. In this manner, the ratio of active silicon-based devices to that of the wide bandgap devices is not fixed anymore by the initial number of semiconductor devices in each element of the hybrid switch (the prior art includes only hybrid switches having two elements), instead this ratio can be continuously changed during the operation by including more elements in the conduction process. Additionally, the diodes are integrated in the switching devices and their performance can be controlled through the control terminals. Furthermore, in conduction mode, both silicon and wide bandgap type of elements will have control signals applied on their control terminals, without the need to differentiate between silicon element only conduction mode, and wide bandgap element only conduction mode. The inventive hybrid switch can be operated in pre-set configurations of elements, called electric or electronic gears, dependent on the operating condition of the power converter.

Those skilled in the art will recognize additional features and advantages upon reading the following detailed description and on viewing the accompanying drawings.

BRIEF DESCRIPTION OF THE DRAWINGS

The embodiments of the invention will be explained in more detail in the following text with reference to the attached drawings, in which.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

In the following Detailed Description, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e. g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e. g. "between" versus "directly between", "adjacent" versus "directly adjacent," etc.).

Furthermore, any numerical examples in the following discussion are intended to be non-limiting, and thus additional numerical values, ranges, and percentages are within the scope of the disclosed embodiments.

Figure 5:
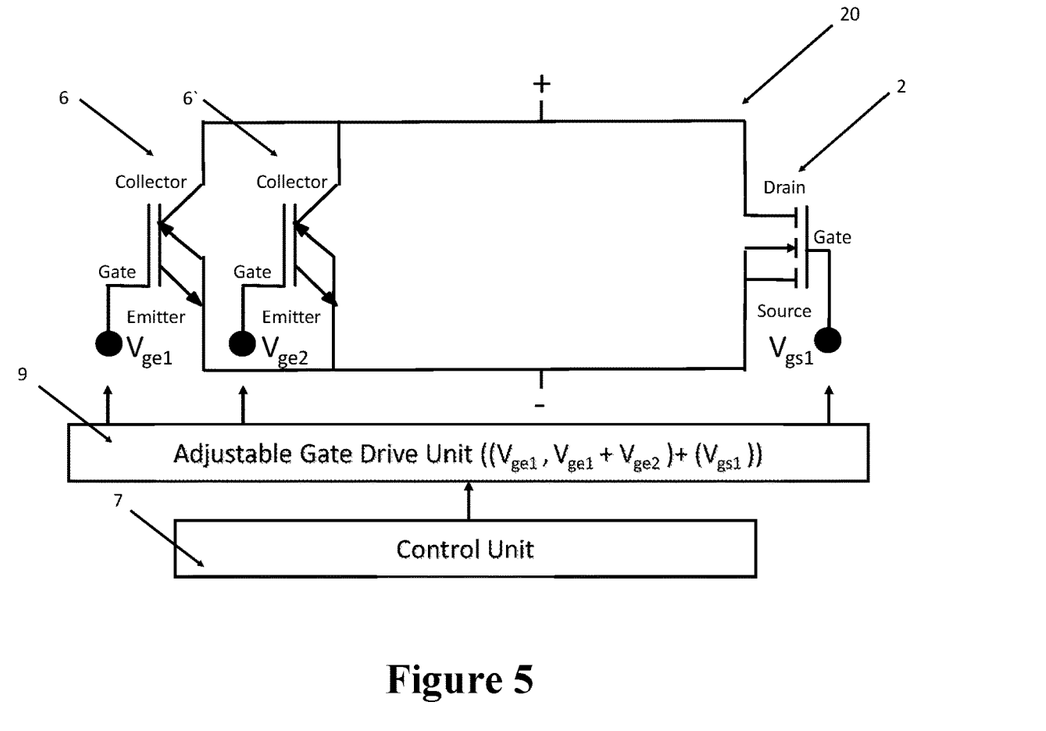
FIG. 5: New Adjustable Hybrid Switch AHS according to the invention, with 3 separate elements: one element comprises SiC MOSFET device and two elements with Si RC-IGBTs devices.
Figure 6:
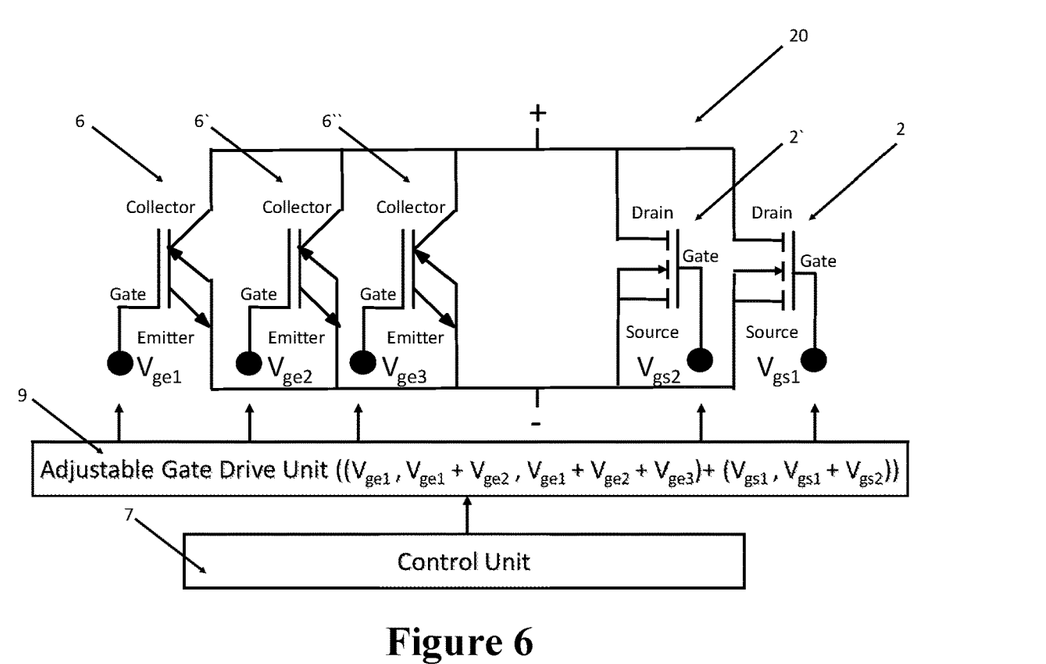
FIG. 6: New Adjustable Hybrid Switch AHS according to the invention, with 5 separate elements: two elements comprise SiC MOSFETs devices and three elements with Si RC-IGBTs devices.

Embodiments of an adjustable hybrid switch (20) configuration for a power converter are provided in FIG. 5 for a three independently controlled elements with two Si RC-IGBTs (6) and (6') and one SiC MOSFET (2). FIG. 6 shows another embodiment for the hybrid switch (20) for a five independently controlled elements with three Si RC-IGBTs (6), (6') and (6") and two SiC MOSFETs (2) and (2').

For the embodiment shown in FIG. 6, the innovative adjustable hybrid switch (20) includes at least three separate elements (6), (6') and (6") each comprising one or more silicon type reverse conducting insulated-gate bipolar transistors or Si RC-IGBTs (6), and two separate elements (2) and (2'), each comprising one or more wide bandgap transistors. To optimize the overall semiconductor costs vs. over-load operating conditions, the wide bandgap elements have a current rating lower than the IGBT elements of the adjustable hybrid switch (20). These elements are electrically coupled together to support parallel currents therein in response to respective separate control signals via the control unit (7) received at respective separate gate control terminals via the adjustable gate drive unit (9) of each independently controlled element.

The configuration of the adjustable hybrid switch (20) enables multiple semiconductor ratios to be active (e.g., in conduction mode) during the operation of the converter. This is important in order to control the conduction and switching losses of the converter. If all elements are active at the same time across the entire range of currents, this can lead to increased switching losses, and consequently to reduced converter efficiency. Due to the fact that each element of the adjustable hybrid switch (20) can be independently controlled, a novel method of operation is also proposed as an embodiment to utilize differently the elements, depending on the amount of power/current of the converter. At low power/current range, one or both SiC MOSFET elements (2) and (2') and only one Silicon RC-IGBT element (6) can be made active. In this case, it may be that the current flows entirely through the SiC MOSFETs elements (2) and (2'), until the voltage drop across the RC-IGBT element (6) increases to above 0.7 Volts and the bipolar threshold is overcome. For medium power/current range, both SiC MOSFET elements (2) and (2') and two of the Silicon RC-IGBT elements (6) and (6') can be made active by corresponding control signals sent to their separate control terminals. For the highest power/current ranges, or in overload conditions, both SiC elements (2) and (2') and all the three Silicon RC-IGBT elements (6), (6') and (6") can be made active.

The advantage of this adjustable hybrid switch configuration (20) becomes apparent based on the novel method of operation described above. Between the cases of converter with low currents and with high currents, the ratio of Silicon RC-IGBT (6) elements to SiC MOSFET (2) elements has been increased by a factor of 2. This has not been achieved in any prior art, where this ratio is in fact fixed by defining the overall number of transistors in the hybrid switch configuration. In addition, because not all Silicon RC-IGBT (6) elements are conducting current at any instant of time, the thermal stress is only impacting some of the elements and not all of them. It is well known that significant temperature swings in semiconductors lead to decrease of lifetime and additional reliability issues. In the novel hybrid switch configuration, only a subset of the transistors is active and therefore exposed to significant temperature swings, while the other transistors are inactive, leading to increased converter reliability and operating lifetime. What is more, if one of the active transistors fails, the control system can activate one of inactive transistors to compensate for the sudden loss of forward conduction capability.

Other embodiments are possible by changing the number of independently controlled elements comprising silicon type transistors, and comprising wide bandgap transistors. For example, a hybrid switch configuration according to this invention disclosure can consist of four SiC MOSFET (2) elements, and eight Silicon RC-IGBT (6) elements. All these twelve elements are independently controlled, and the method of operation follows closely the one described as part of the main embodiment. Of course, increasing the number of elements in the adjustable hybrid switch (20) will increase accordingly the cost and the complexity of the converter. However, with an increased number of elements, a better granularity is reached in terms of changing the ratios of semiconductor areas depending on the relevant operating conditions. Therefore, an optimum case has to be always identified taking into account normal operating conditions of the converter vs. the probability and extent of incurring over-load operating conditions.

According to some embodiments of the invention, the same control circuit (or controller) can be used in freewheeling mode to control the diode semiconductor areas in RC-IGBTs (6) elements, by adjusting the applied control signals in a similar way to controlling the current sharing between parallel RC-IGBT (6) elements in conduction mode.

Still further embodiments of the invention include an adjustable hybrid switch configuration (20), a power converter, and a system microcontroller (MCU) which processes multiple inputs from monitoring/sensing devices, torque and speed of the electrical motor (in case the converter is used to drive a motor for example in electrical cars), current sensors or voltage and frequency of the power grid (in case the converter is used as interface between a renewable energy source system and the electrical network) to enable the controller unit (7) to assess the operating conditions as close as possible to the reality. The controller independently controls via the adjustable gate drive unit (9) the SiC MOSFET (2) elements and the Silicon RC-IGBT (6) elements of the adjustable hybrid switch (20).

In certain embodiments, the controller may control the SiC MOSFET (2) elements and the Silicon RC-IGBT (6) elements differently based on a power and current level required by the converter. In particular, the controller may be configured to activate a finite number of configurations of the elements in the hybrid switch (called also "electrical gears" or "electronic gears") that are automatically set based on the measured or estimated operating conditions of the power converter. Specific optimization criteria can be used for example: for minimizing switching and/or conduction losses or increasing the lifetime of the power converter. The configurations of active elements may be estimated by a processor/system on chip (SoC)/ASIC devices in real time, or can be stored in a look-up table within a memory unit which can be any suitable storage device that enables the processor to store, retrieve, and/or execute instructions and/or data.

Figure 7:
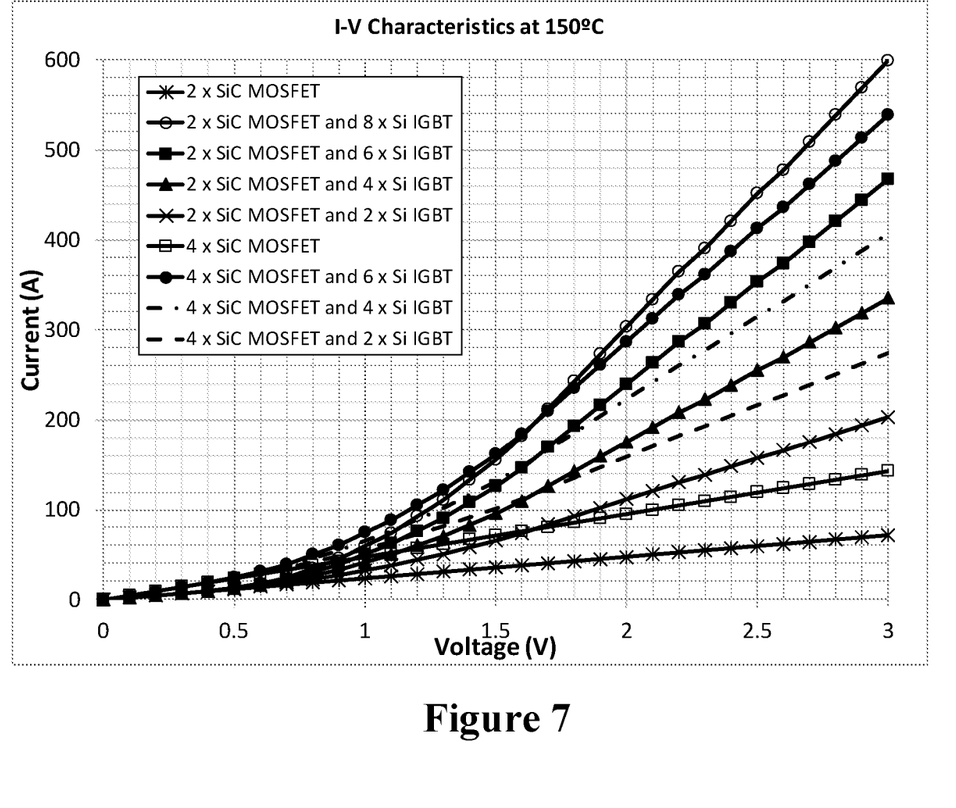
FIG. 7: Illustrates a plurality of output I-V curves associated with respective configurations, according to embodiments of the invention. The Adjustable Hybrid Switch AHS has 8 different elements configured with RC-IGBTs and 4 different elements configured with SiC MOSFETs (1200V class devices, rated 50 A each).

Based on the determination of the power and the current needed by the converter, the method of operation includes independently controlling which elements of the hybrid switch are to be utilized. This leads to the introduction of an innovative concept of "electrical gears" or "electronic gears" which is uniquely enabled by the innovative adjustable hybrid switch (20) configuration with semiconductor switching devices. In order to better understand these concepts, reference is made to FIG. 7 that represents I-V graphs for various combinations of SiC MOSFET (2) and Silicon RC-IGBT (6) elements in a hybrid switch with up to twelve independent elements. With reference to FIG. 7, if the selected optimization principle is increasing the lifetime of the converter, then the controller will aim to minimize the number of elements active for each range of currents (to avoid unnecessary temperature swings on the transistors for example):

- at high currents for example between 300 A to 400 A, a "first electronic gear" is defined as the hybrid switch configuration (20) where two SiC MOSFET (2) elements and six Silicon RC-IGBT (6) elements are made active in conduction mode (e.g., using only 8 elements, and corresponding to an on-state voltage of 2.7 V at a current of 400 A)
- at medium currents between 100 A to 300 A, a "second electronic gear" can be represented by the hybrid switch configuration where two SiC MOSFET (2) elements and four Silicon RC-IGBT (6) elements are made active (e.g., using only 6 elements and corresponding to an on-state voltage of 2.15V at a current of 200 A)
- at low currents below 100 A, the "third electronic gear" can be defined as the hybrid switch configuration where two SiC MOSFET (2) elements and only two Silicon RC-IGBT (6) elements are made active (e.g., using only 4 elements and corresponding to an on-state voltage of 1.3V at a current of 50 A).

Similarly, if the optimization criteria for the controller is to minimize the conduction losses of the converter, a different set of "electronic gears" can be defined based on using an increased number of elements for each range of currents. Accordingly, and with reference to the same FIG. 7:

- at high currents, a "first electronic gear" can be defined as the hybrid switch configuration where four SiC MOSFET (2) elements and six Silicon RC-IGBT (6) elements are made active in conduction mode. Now a total of ten elements are active vs. eight elements as previously described for the criteria of increased converter lifetime. The corresponding on-state voltage is now smaller, as expected, of about 2.45 V at a current of 400 A
- at medium currents, a "second electronic gear" can be represented by the hybrid switch configuration where four SiC MOSFET (2) elements and four Silicon RC-IGBT (6) elements are made active. This is a total of eight active elements, compared to the previous criteria with six active elements. However, as expected, the on-state is now reduced to about 1.9 V at a current of 200 A
- at low currents, the "third electronic gear" can be defined as the hybrid switch configuration where four SiC MOSFET (2) elements and two Silicon RC-IGBT (6) elements are made active. This is a total of six active elements, compared to the previously described criteria with four active elements. However, also in this case, the on-state is now reduced to about 1V at a current of 50 A.

The above description can be enlarged to consider additional pre-set configurations of the active elements leading to different numbers and definitions of the corresponding "electronic gears". By means of example, if the hybrid switch (20) is configured to have X number of Silicon RC-IGBT elements (6), and Y number of SiC MOSFET elements (2), then the possible total number of gears will be equal to X multiplied by Y, where the total number of elements is given by the following boundary condition: $(X+Y) \geq 3$.

Thus, if the hybrid switch is configured with 2× Silicon RC-IGBTs (6) and 1× SiC MOSFET (2), then the system will provide 2 electronic gears which can be used to adjust the ratio of active areas between Silicon and Silicon Carbide elements in two steps:

- one operating mode where 1× Silicon RC-IGBT and 1×SiC MOSFET are active;
- one operating mode where 2× Silicon RC-IGBT and 1×SiC MOSFET are active.

Furthermore, in another embodiment, the hybrid switch (20) can be configured with 3× Silicon RC-IGBTs (6) and 2× SiC MOSFET (2), then the system will provide 6 electronic gears which can be used to adjust the ratio of active areas between Silicon and Silicon Carbide elements in six steps:

- one operating mode where 1× Silicon RC-IGBT and 1×SiC MOSFET are active;
- one operating mode where 2× Silicon RC-IGBT and 1×SiC MOSFET are active;
- one operating mode where 3× Silicon RC-IGBT and 1×SiC MOSFET are active;
- one operating mode where 1× Silicon RC-IGBT and 2×SiC MOSFETs are active;
- one operating mode where 2× Silicon RC-IGBT and 2×SiC MOSFETs are active;
- one operating mode where 3× Silicon RC-IGBT and 2×SiC MOSFETs are active.

The method of operation described until now made reference to the forward conduction mode of the adjustable hybrid switch (20) elements, and how to dynamically adjust the ratio of silicon to silicon carbide semiconductor areas using the availability of separate control terminals; however, an additional embodiment includes details regarding the switching on/off of the adjustable hybrid switch (20). First, the silicon RC-IGBT (6) and SiC MOSFET (2) elements are turned on, and depending on the range of power/current, most of the current will pass through the Si RC-IGBT (6) elements due to the low $R_{Ds(on)}$ (e.g., relative to the SiC MOSFET (2) elements), or will pass through the SiC MOSFET (2) elements (if the voltage drop across the Si RC-IGBT (6) is lower than approximately 0.7 Volts, which can be the case for very low converter currents). After the conduction time period is over, the Si RC-IGBT (6) elements can be switched off before the SiC MOSFET (2) elements, which causes most of the current to pass through the SiC MOSFET (2) elements. Finally, the SiC MOSFET (2) elements are also switched off. According to this method of operation, at medium and high currents, the SiC MOSFET (2) elements are conducting current for a short period of time (e.g., relative to the time the Si RC-IGBT (6) elements of the hybrid switch (20) are conducting current). As a result, conduction losses are low or minimal. The tail current of the Si RC-IGBT (6) elements does not add to the switching losses since the voltage applied across the hybrid switch (20) during commutation is close to zero (e.g., the on-state voltage of the Si RC-IGBT (6) in forward conduction mode). Thus, both switching losses and conduction losses are minimized during use of the hybrid switch (20) configuration. In over-load conditions e.g., short-circuits, it can also be possible to first switch off the SiC MOSFET (2) elements to better protect them, given their possible limitations in Safe Operating Area compared to the more robust Silicon RC-IGBT technologies.

Technical effects of the disclosed embodiments of the adjustable hybrid switch (20) for the power converter application include increasing power capability, while reducing the footprint and cost of the converter. In addition, utilization of the adjustable hybrid switch (20) improves the assembly of the power converter by reducing the number of mechanical parts (for example no additional freewheeling diodes (5) are needed). Further, the reduction in the number of components in the converter and the electrical and thermal stress during over-load conditions improve the converter's reliability. Furthermore, because not all elements are active in all operating conditions, the adjustable hybrid switch (20) has a built-in redundancy capability, e.g., in the case of partial fault, if one active element fails, its place could be taken by an additional element that was initially inactive.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE LIST

1: cross hybrid switch
2: SiC MOSFET
2': second element SiC MOSFET
3: Si IGBT
3': second element Si IGBT
4: hybrid switch gate drive unit
5: Diode
5': second element Diode
6: Si RC-IGBT
6': second element Si RC-IGBT
6": third element Si RC-IGBT
7: control unit
8: three mode hybrid switch gate drive unit
9: inventive adjustable hybrid switch gate drive unit
10: three mode hybrid switch
20: inventive adjustable hybrid switch

The invention claimed is:

1. A hybrid switch for a power converter, comprising:
a first element and a second element, each comprising one or more switching devices of a first semiconductor type, and a third element comprising one or more switching devices of a second semiconductor type, wherein the second semiconductor type is different from the first semiconductor type, and wherein the first element is connected to a first control terminal, the second control element is connected to a second control terminal, and the third element is connected to a third control terminal, wherein the first element, the second element, and the third element are independently configurable; and
a controller connected to the first control terminal, a second control terminal, and a third control terminal and configured to activate one or more of the first element, the second element, and the third element in real time through the first control terminal, the second control terminal, and the third control terminal based on current and power defined by instantaneous operating conditions of the power converter, and wherein the controller is configured to adjust the semiconductor area ratios of switching devices of the first semiconductor type and the second semiconductor type.

2. The hybrid switch according to claim 1, wherein the first semiconductor type comprises silicon reverse conducting IGBTs with integrated diode functionality, and wherein the second semiconductor type comprises a SiC MOSFET.

3. The hybrid switch according to claim 1, wherein the controller is further configured to activate the first element, the second element, and the third element independently and separately according to optimization criteria, wherein the optimization criteria comprise one of:
   minimizing switching and/or conduction losses; or
   increasing an operating lifetime of the power converter.

4. The hybrid switch according to claim 1, wherein the controller is further configured to activate, based on a current range and/or power range of the power converter, a configuration of elements of the hybrid switch from a plurality of pre-defined combinations of elements stored as a look-up table in the controller comprising switching devices of both first and second semiconductor types.

5. The hybrid switch according to claim 4, wherein the controller is further configured to activate the configuration of elements of the hybrid switch according to optimization criteria, wherein the optimization criteria comprise one of:
   minimizing switching and/or conduction losses; and
   increasing an operating lifetime of the power converter.

6. The hybrid switch according to claim 1, wherein the controller is configured to activate some of the first element, the second element, and the third element when the optimization criteria comprises increasing an operating lifetime of the power converter and additional ones of the first element, the second element, and the third element when the optimization criteria comprises minimizing switching and/or conduction losses.

7. The hybrid switch according to claim 1, wherein the first semiconductor type comprise a silicon reverse conducting IGBT with integrated diode functionality, and wherein the second semiconductor type comprise a MOSFET.

8. The hybrid switch according to claim 1, wherein the second semiconductor type comprises a GaN HEMT or a FET.

9. The hybrid switch according to claim 1, wherein the first semiconductor type comprises a parallel arrangement of a separate silicon IGBT and a standalone Silicon or SiC diode.

* * * * *